(12) United States Patent
Yoshikawa (10) Patent No.: US 10,524,383 B2
(45) Date of Patent: Dec. 31, 2019

(54) INVERTER DEVICE

(71) Applicant: FUJI ELECTRIC CO., LTD., Kawasaki-shi, Kanagawa (JP)

(72) Inventor: Tomokazu Yoshikawa, Yokkaichi (JP)

(73) Assignee: FUJI ELECTRIC CO., LTD., Kawasaki-Shi, Kanagawa (JP)

(*) Notice: Subject to any disclaimer, the term of this patent is extended or adjusted under 35 U.S.C. 154(b) by 7 days.

(21) Appl. No.: 15/884,034

(22) Filed: Jan. 30, 2018

(65) Prior Publication Data

US 2018/0279504 A1 Sep. 27, 2018

(30) Foreign Application Priority Data

Mar. 22, 2017 (JP) ................ 2017-055607

(51) Int. Cl.
*H05K 7/20* (2006.01)
*H05K 7/14* (2006.01)
*H02K 5/18* (2006.01)
*H02M 7/00* (2006.01)
*H01L 23/473* (2006.01)
*H01L 23/467* (2006.01)

(52) U.S. Cl.
CPC ........ *H05K 7/20154* (2013.01); *H02K 5/18* (2013.01); *H02M 7/003* (2013.01); *H05K 7/1432* (2013.01); *H05K 7/209* (2013.01); *H05K 7/20918* (2013.01); *H01L 23/467* (2013.01)

(58) Field of Classification Search
CPC ....... G06F 1/181–182; H05K 7/20218–20381; H05K 7/20409–20418; H05K 7/20009–202; H05K 7/20154; H05K 7/1432; H05K 7/209; H05K 7/20918; H01L 23/367–3677; H01L 23/473; H01L 23/46–467; H02K 5/18; H05M 7/003
USPC ...... 361/676–678, 679.46–679.54, 688–723, 361/699–704, 709–10, 719–721; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

| | | | | |
|---|---|---|---|---|
| 8,730,672 | B2* | 5/2014 | Ebersberger | H01L 23/473 |
| | | | | 174/15.1 |
| 9,474,146 | B2* | 10/2016 | Hori | H01L 23/3735 |
| 2004/0223304 | A1* | 11/2004 | Kobayashi | B60R 16/0238 |
| | | | | 361/715 |
| 2007/0253159 | A1* | 11/2007 | Lin | G06F 1/181 |
| | | | | 361/679.46 |
| 2008/0158824 | A1* | 7/2008 | Aoki | H01L 23/24 |
| | | | | 361/711 |
| 2008/0239663 | A1* | 10/2008 | Yamamoto | H01L 23/473 |
| | | | | 361/691 |

(Continued)

FOREIGN PATENT DOCUMENTS

JP 2013-251328 A 12/2013

*Primary Examiner* — Jayprakash N Gandhi
*Assistant Examiner* — Razmeen Gafur
(74) *Attorney, Agent, or Firm* — Manabu Kanesaka (57) ABSTRACT

An inverter device includes a heat generator, a cooler, and a cooler-side housing that covers the cooler and includes an opening that exposes a side of the cooler closer to the heat generator, and a circumferential rib that comes into contact with the cooler is provided in a vicinity of a peripheral edge of the opening of the cooler-side housing.

10 Claims, 6 Drawing Sheets

(56) References Cited

U.S. PATENT DOCUMENTS

| | | | |
|---|---|---|---|
| 2009/0231811 A1* | 9/2009 | Tokuyama | H01L 23/36 361/699 |
| 2010/0053898 A1* | 3/2010 | Isomoto | H02M 7/003 361/697 |
| 2011/0069455 A1* | 3/2011 | Tokuyama | H01L 23/473 361/702 |
| 2011/0216545 A1* | 9/2011 | Russo | H01R 9/031 362/362 |
| 2012/0170217 A1* | 7/2012 | Nishikimi | H05K 7/20927 361/689 |
| 2013/0044434 A1* | 2/2013 | Sharaf | H05K 7/20927 361/702 |
| 2013/0119908 A1* | 5/2013 | Harada | H02P 6/10 318/400.42 |
| 2014/0009890 A1* | 1/2014 | Moon | H05K 7/20445 361/707 |
| 2014/0321065 A1* | 10/2014 | Nishimura | H05K 1/0203 361/722 |
| 2014/0355212 A1* | 12/2014 | Campbell | H05K 7/20236 361/699 |
| 2014/0376184 A1* | 12/2014 | Gohara | H01L 23/473 361/689 |
| 2015/0163962 A1* | 6/2015 | Suzuki | H02M 7/003 361/699 |
| 2015/0189790 A1* | 7/2015 | Tachibana | H05K 7/20254 361/699 |
| 2015/0245535 A1* | 8/2015 | Fujita | H02M 7/003 361/689 |
| 2015/0271956 A1* | 9/2015 | Sun | H05K 7/20927 361/692 |
| 2015/0289410 A1* | 10/2015 | Salat | H01L 23/473 361/699 |
| 2015/0296661 A1* | 10/2015 | Mari Curbelo | H01L 23/427 361/700 |
| 2015/0334874 A1* | 11/2015 | Rai | H05K 7/20254 361/699 |
| 2016/0037677 A1* | 2/2016 | Yamanaka | H05K 7/20918 361/697 |
| 2016/0105992 A1* | 4/2016 | Krivonak | H05K 7/209 361/707 |
| 2016/0120069 A1* | 4/2016 | Raassina | H05K 7/20509 361/697 |
| 2017/0294821 A1* | 10/2017 | Shimizu | H02K 5/20 |

* cited by examiner

INVERTER DEVICE

CROSS-REFERENCE TO RELATED APPLICATION

The priority application number JP2017-055607, Inverter Device, Mar. 22, 2017, Tomokazu Yoshikawa, upon which this patent application is based, is hereby incorporated by reference.

BACKGROUND OF THE INVENTION

Field of the Invention

The present invention relates to an inverter device, and more particularly, it relates to an inverter device including a cooler-side housing that covers a cooler.

Description of the Background Art

An inverter device including a cooler-side housing that covers a cooler is known in general, as disclosed in Japanese Patent Laying-Open No. 2013-251328.

Japanese Patent Laying-Open No. 2013-251328 discloses an outdoor installation device including a cooler-side housing that covers a cooler. In this outdoor installation device, a heatsink that cools a semiconductor component, which is a heating element, is provided. The heatsink includes a flat base plate and radiation fins provided on the base plate. The semiconductor component is placed on the surface (upper surface) of the base plate on the side opposite to the side on which the radiation fins are provided.

In addition, in this outdoor installation device, a box-shaped housing covers the surface of the base plate on the side on which the semiconductor component is placed. Specifically, the flat base plate covers an opening of the box-shaped housing. Thus, the semiconductor component is disposed in a space surrounded by the housing and the surface of the base plate. A frame-shaped seal member corresponding to the shape (substantially rectangular shape) of the opening of the housing is provided between the housing and the base plate. The seal member is provided separately from the housing. The seal member is made of butyl rubber, for example. Thus, the space surrounded by the housing and the surface of the base plate is sealed. Consequently, dust and the like are prevented from entering the inside of the housing from a gap between the housing and the surface of the base plate.

However, in the outdoor installation device described in Japanese Patent Laying-Open No. 2013-251328, the seal member is provided separately from the housing in order to prevent dust and the like from entering the inside of the housing from the gap between the housing and the surface of the base plate. Therefore, the seal member is provided, and hence the number of components disadvantageously increases.

SUMMARY OF THE INVENTION

The present invention has been proposed in order to solve the aforementioned problem, and an object of the present invention is to provide an inverter device including a waterproof and dustproof structure while significantly reducing or preventing an increase in the number of components.

In order to attain the aforementioned object, an inverter device according to an aspect of the present invention includes a heat generator including a power conversion element, a cooler that cools the heat generator, and a cooler-side housing that covers the cooler and includes an opening that exposes a side of the cooler closer to the heat generator, and a circumferential rib that comes into contact with the cooler is provided in a vicinity of a peripheral edge of the opening of the cooler-side housing.

In the inverter device according to this aspect of the present invention, as hereinabove described, the circumferential rib that comes into contact with the cooler is provided in the vicinity of the peripheral edge of the opening of the cooler-side housing. Thus, intrusion of water and dust from the opening of the cooler-side housing into the heat generator (or from the heat generator into the cooler-side housing side) is prevented by the circumferential rib provided on the cooler-side housing. Consequently, it is not necessary to provide a component such as a sealing material for constructing a waterproof and dustproof structure separately from the cooler-side housing. Thus, it is possible to construct the waterproof and dustproof structure while significantly reducing or preventing an increase in the number of components. Furthermore, the waterproof and dustproof structure is constructed with the rib instead of the surface of the cooler-side housing closer to the cooler, and hence the area of a portion of the rib that comes into contact with the cooler is relatively small such that it is possible to significantly reduce or prevent transfer of heat from the cooler to the cooler-side housing.

When the number of components (types of components) increases, it is necessary to design the inverter device in consideration of the heat resistance, lifetime, etc. of an increased component as well as the heat resistance and lifetime of the existing components. That is, it is possible to significantly reduce or prevent the design complexity of the inverter device by significantly reducing or preventing an increase in the number of components.

In the aforementioned inverter device according to this aspect, the rib preferably includes a first rib that protrudes from the vicinity of the peripheral edge of the opening of the cooler-side housing toward the cooler and a second rib provided on an outer peripheral side of the first rib and that protrudes from the vicinity of the peripheral edge of the opening toward the cooler. According to this structure, the rib includes dual ribs, and hence it is possible to more effectively prevent intrusion of water and dust from the opening of the cooler-side housing into the heat generator.

In this case, a flow path through which a fluid flows is preferably defined by a space surrounded by the first rib and the second rib of the cooler-side housing and the cooler, and a hole that serves as an inlet and outlet of the fluid is preferably provided in at least a bottom of the circumferential second rib in a state where an inverter device body is installed. According to this structure, the fluid (such as water) that flows through the flow path is discharged out of the flow path from the hole provided in the bottom. Thus, it is possible to significantly reduce or prevent accumulation of the fluid (such as water) in the flow path.

In this case, the hole is preferably provided in the bottom and a top of the circumferential second rib in the state where the inverter device body is installed. According to this structure, the fluid (such as cooling air) that moves from the lower side to the upper side flows in through the hole provided in the bottom, and flows out from the hole provided in the top through the flow path. That is, the fluid (such as cooling air) that moves from the lower side to the upper side moves without stagnation, and hence it is possible to significantly reduce or prevent a reduction in the cooling efficiency of the cooler.

The aforementioned inverter device including the first rib and the second rib preferably further includes a fastening member that fixes the cooler-side housing to the cooler, and the first rib and the second rib are preferably pressed against the cooler by fastening the fastening member to the cooler-side housing and the cooler on the outer peripheral side of the first rib. According to this structure, due to the fastening force of the fastening member, the first rib and the second rib come into contact with the cooler in a state where the first rib and the second rib are strongly pressed against the cooler. Consequently, occurrence of gaps between both the first rib and the second rib and the cooler is significantly reduced or prevented. As a result, it is possible to further significantly reduce or prevent intrusion of water and dust from the opening of the cooler-side housing into the heat generator.

In this case, a protruding length of the first rib toward the cooler is preferably equal to or greater than a protruding length of the second rib toward the cooler. When the cooler-side housing is fixed to the cooler by the fastening member on the outer peripheral side of the first rib, the peripheral edge of the opening of the cooler-side housing on which the first rib and the second rib are provided may be flexed to be recessed toward the cooler due to the fastening force of the fastening member. In this case, the first rib may be lifted so as to be separate from the cooler. Therefore, the protruding length of the first rib toward the cooler is set to be greater than the protruding length of the second rib toward the cooler such that it is possible to significantly reduce or prevent separation of the first rib from the cooler. Consequently, it is possible to significantly reduce or prevent intrusion of water and dust from the gap between the first rib and the cooler. Furthermore, when the first rib is not separate (not lifted) from the cooler, the protruding length of the first rib toward the cooler and the protruding length of the second rib toward the cooler may be equal to each other. Even in this case, it is possible to significantly reduce or prevent intrusion of water and dust from the gap between the first rib and the cooler.

The aforementioned inverter device according to this aspect preferably further includes a reinforcing rib that protrudes from the vicinity of the peripheral edge of the opening of the cooler-side housing toward a side opposite to a side on which the cooler is placed. According to this structure, the strength of a portion of the cooler-side housing in the vicinity of the rib is increased by the reinforcing rib, and hence deformation of the portion of the cooler-side housing in the vicinity of the rib is significantly reduced or prevented. Consequently, occurrence of the gap between the rib and the cooler due to the deformation of the portion of the cooler-side housing in the vicinity of the rib is significantly reduced or prevented. Consequently, it is possible to further significantly reduce or prevent intrusion of water and dust into the heat generator from the opening of the cooler-side housing.

The aforementioned inverter device according to this aspect preferably further includes a wall that protrudes from the vicinity of the peripheral edge of the opening of the cooler-side housing toward the cooler on an outer peripheral side of the rib so as to cover a top surface of the cooler in a state where an inverter device body is installed. According to this structure, the wall can significantly reduce or prevent direct dropping of water, which drops from the top surface side, onto the cooler.

In this case, the cooler preferably includes a plate-like portion on which the heat generator is placed and a fin that extends from the plate-like portion, and the wall preferably does not cover a top surface of the fin but covers a top surface of the plate-like portion. According to this structure, the fin is not covered by the wall, and hence it is possible to prevent the wall from blocking flow of cooling air that hits the fin (that passes between the fins).

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention is hereinafter described with reference to the drawings.

Present Embodiment

The structure of an inverter device 100 according to the present embodiment is now described with reference to FIGS. 1 to 11. The inverter device 100 converts input AC power into set AC power and outputs the AC power.

(Overall Structure of Inverter Device)

Figure 1:
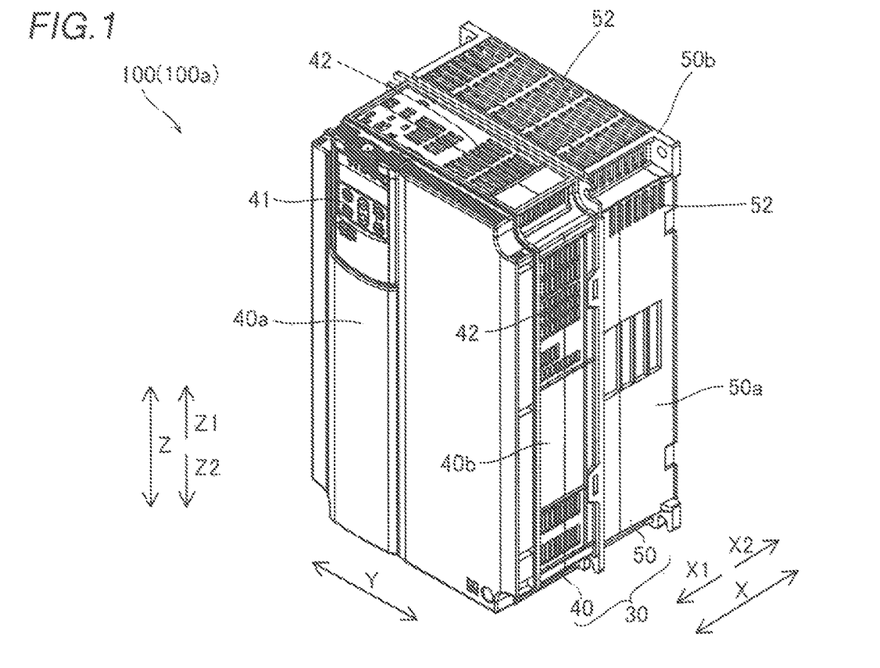
FIG. 1 is a perspective view of an inverter device according to an embodiment of the present invention.
Figure 2:
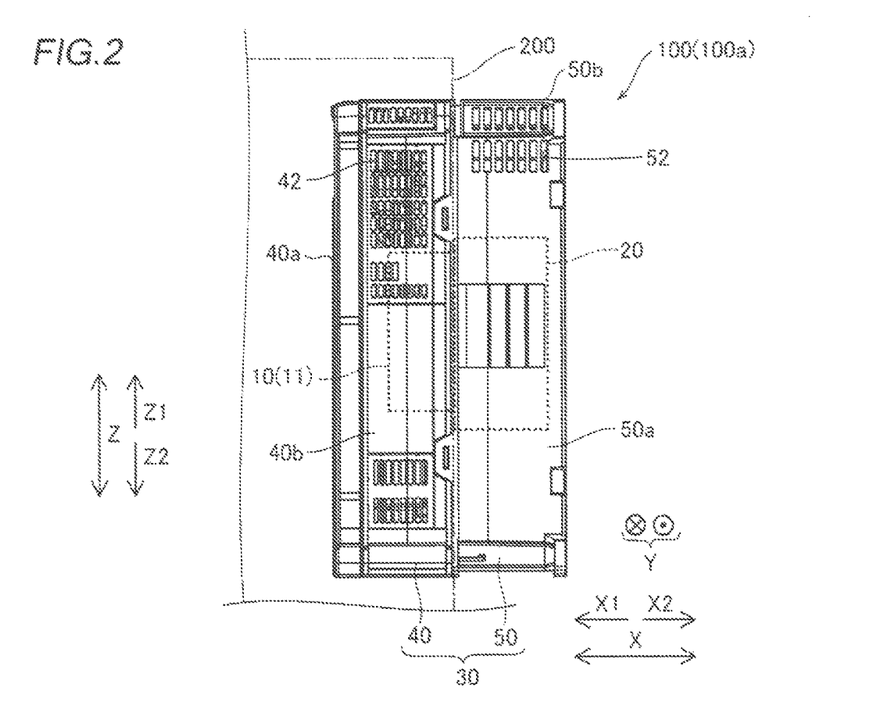
FIG. 2 is a side elevational view of the inverter device according to the embodiment of the present invention.
Figure 3:
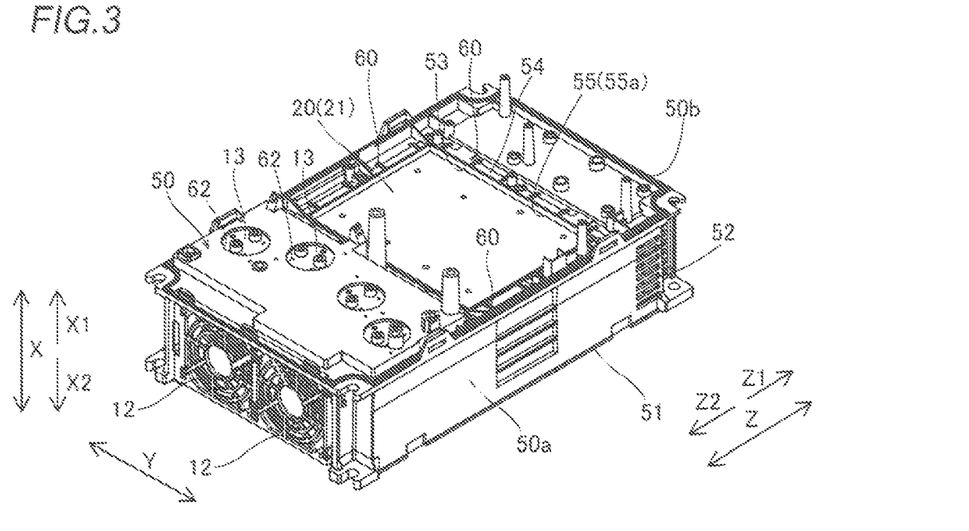
FIG. 3 is a perspective view of the rear housing side of the inverter device according the embodiment of the present invention.

As shown in FIGS. 1 and 2, the inverter device 100 includes a power conversion circuit 10 including a power conversion element 11 that generates heat during power conversion, a cooler 20 that cools the power conversion circuit 10, a housing 30 that houses the power conversion circuit 10 and the cooler 20, and fans 12 (see FIG. 3) that discharge air inside the housing 30. The power conversion circuit 10 is an example of a "heat generator" in the claims.

As shown in FIG. 2, the housing 30 includes a front housing 40 disposed inside a power board 200 and a rear housing 50 disposed outside the power board 200. Both the front housing 40 and the rear housing 50 are made of resin, for example. The inverter device 100 is disposed in the power board 200 such that the longitudinal direction of the housing 30 is along a direction Z (upward-downward direction). The rear housing 50 is an example of a "cooler-side housing" in the claims.

The front housing 40 covers the power conversion circuit 10 including the power conversion element 11. An operator 41 (see FIG. 1) is provided on the front surface 40a of the front housing 40. Furthermore, vent holes 42 are provided on the side surface 40b of the front housing 40.

Figure 4:
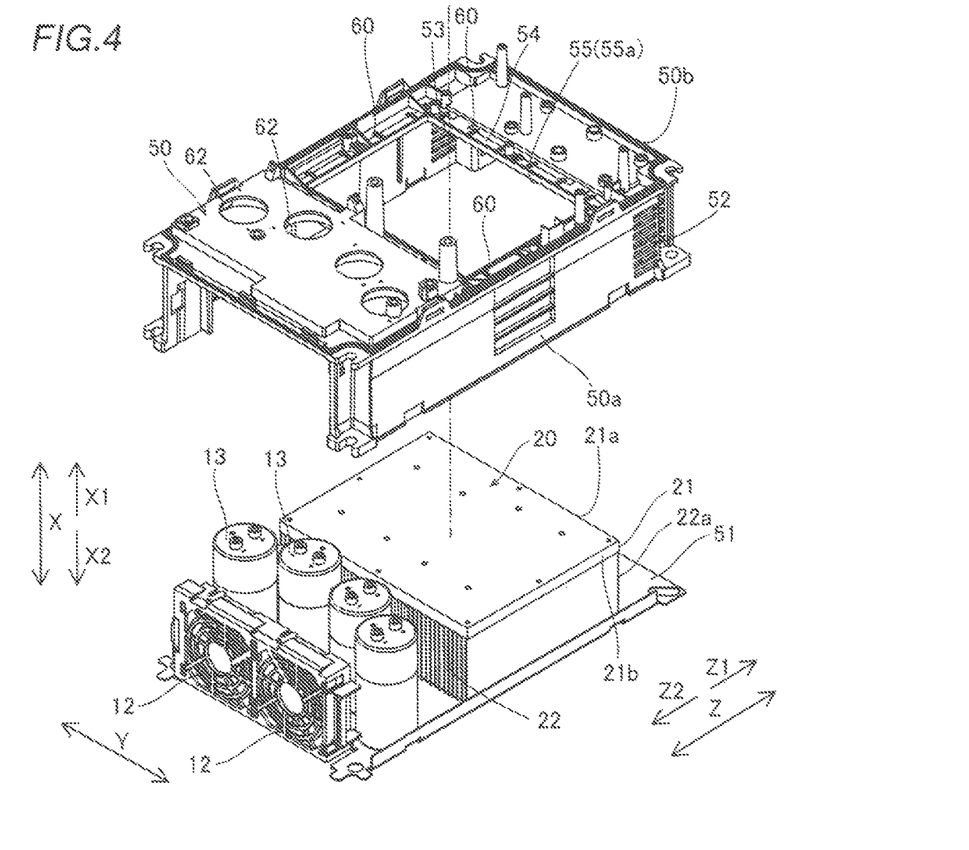
FIG. 4 is an exploded perspective view of the rear housing side of the inverter device according to the embodiment of the present invention.

As shown in FIG. 4, the rear housing 50 covers the cooler 20, capacitors 13, and the fans 12. The cooler 20, the capacitors 13, and the fans 12 are provided on a surface of a rear surface portion 51. The cooler 20, the capacitors 13, and the fans 12 are disposed in a space between the rear housing 50 and the rear surface portion 51. The fans 12, the capacitors 13, and the cooler 20 are arranged in this order from the lower side to the upper side (in the direction Z). Furthermore, vent holes 52 are provided on the side surface 50a and the top surface 50b of the rear housing 50. Thus, cooling air taken in from below by the fans 12 flows out from the vent holes 52 via the capacitors 13 and the cooler 20 (fins 22 described below). As a result, the power conversion circuit 10 that has generated heat is cooled via the cooler 20.

As shown in FIG. 4, the cooler 20 includes a plate-like portion 21 on which the power conversion circuit 10 is placed and the fins 22 that extend from the plate-like portion 21. The plate-like portion 21 is disposed on the front side (X1 direction side) of the inverter device 100. The fins 22 extend to the rear side (X2 direction side) of the inverter device 100.

(Structure of Rear Housing)

Figure 5:
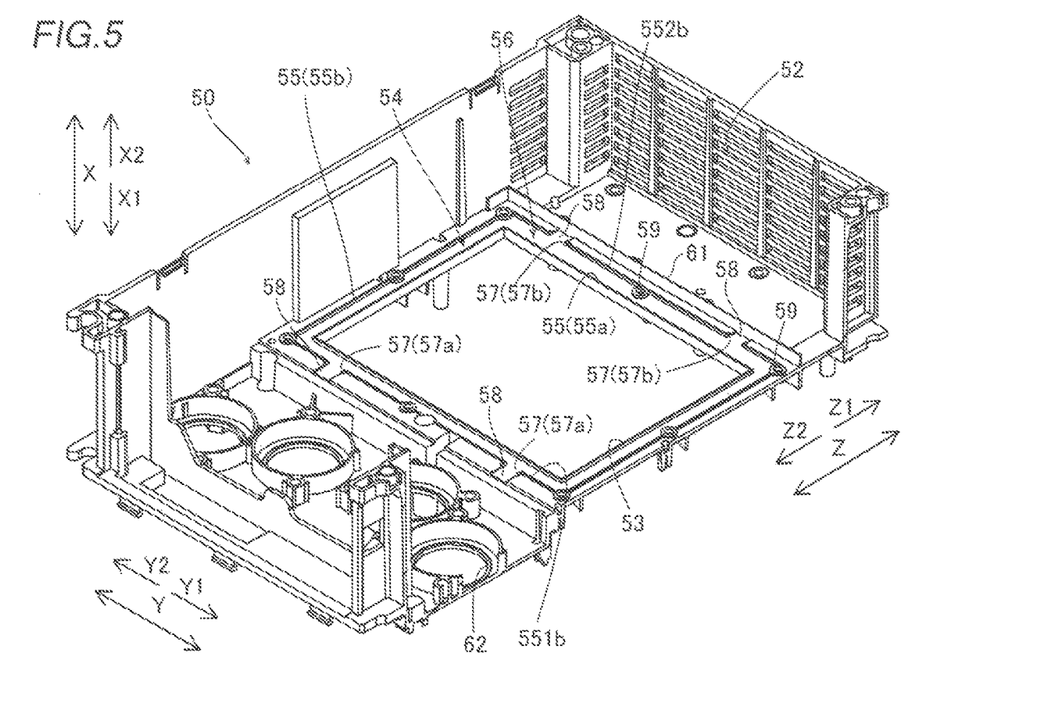
FIG. 5 is a perspective view of a rear housing of the inverter device as viewed from the X2 direction side according to the embodiment of the present invention.

The structure of the rear housing 50 is now described with reference to FIGS. 5 to 11. In FIG. 5, the side surface of the rear housing 50 on the Y1 direction side is removed.

Figure 6:
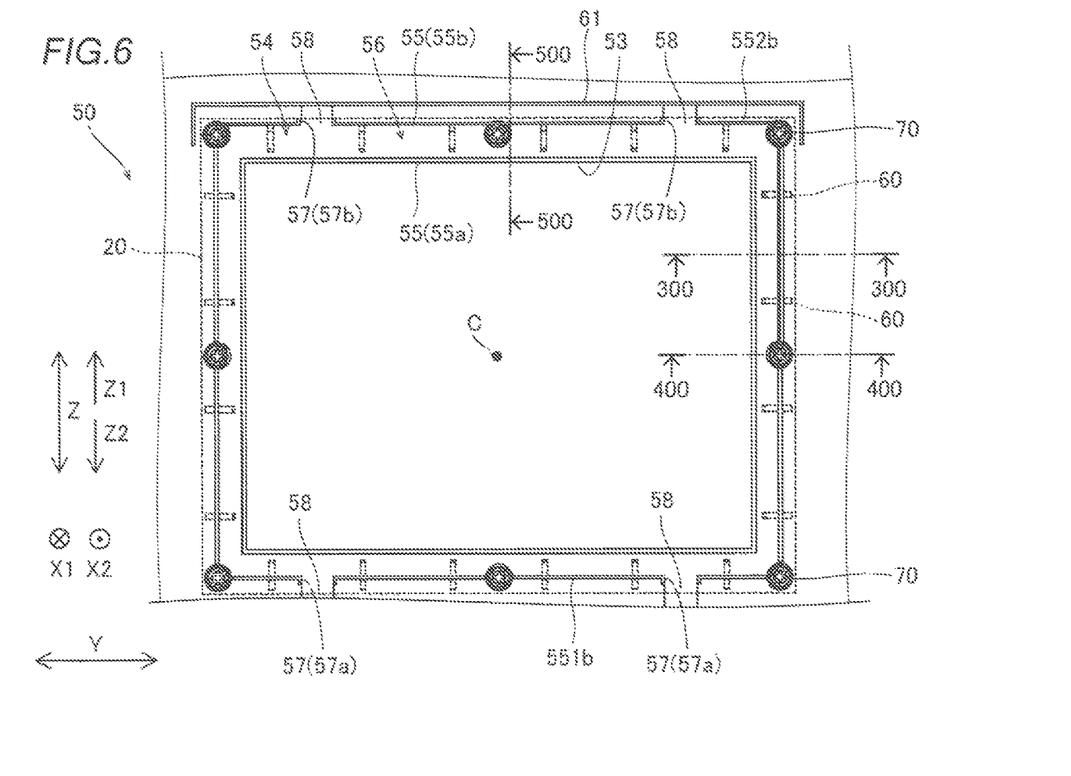
FIG. 6 is a plan view of the rear housing of the inverter device as viewed from the X2 direction side according to the embodiment of the present invention.

As shown in FIGS. 5 and 6, the rear housing 50 includes an opening 53 that exposes the side of the cooler 20 closer to the power conversion circuit 10. Specifically, the opening 53 has a substantially rectangular shape in a planar view. As shown in FIG. 6, the opening 53 does not expose the vicinity of the outer edge of the side (plate-like portion 21) of the cooler 20 (see a dotted line in FIG. 6) closer to the power conversion circuit 10 but exposes the center side in the planar view.

According to the present embodiment, as shown in FIG. 6, a circumferential rib 55 that comes into contact with the cooler 20 is provided in the vicinity of the peripheral edge 54 of the opening 53 of the rear housing 50. A waterproof and dustproof structure is constructed with the rib 55. Note that the peripheral edge 54 denotes a portion of the frame-shaped rear housing 50 that circumferentially surrounds the opening 53. The rib 55 is integral with the rear housing 50. In other words, the rear housing 50 and the rib 55 are made of the same material.

Specifically, according to the present embodiment, the rib 55 includes a first rib 55a that protrudes from the vicinity of the peripheral edge 54 of the opening 53 of the rear housing 50 toward the cooler 20 (X2 direction side) and a second rib 55b provided on the outer peripheral side of the first rib 55a and that protrudes from the vicinity of the peripheral edge 54 of the opening portion 53 toward the cooler 20 (X2 direction side).

The first rib 55a is provided circumferentially along the edge of the opening 53. That is, the first rib 55a has a frame shape as viewed from the X2 direction side. In addition, the first rib 55a extends perpendicularly (in a direction X) with respect to a direction (direction Z) along a surface of the plate-like portion 21 of the cooler 20. The protruding length L1 (see FIG. 8) of the first rib 55a toward the cooler 20 is substantially the same in any portion of the first rib 55a. The frame-shaped first rib 55a is provided circumferentially along the edge of the opening 53 uninterrupted (continuously).

The second rib 55b is separate from the first rib 55a outside the edge of the opening 53. In addition, the second rib 55b extends perpendicularly (in the direction X) with respect to the direction (direction Z) along the surface of the plate-like portion 21 of the cooler 20. The protruding length L2 (see FIG. 8) of the second rib 55b toward the cooler 20 is substantially the same in any portion of the second rib 55b.

Figure 8:
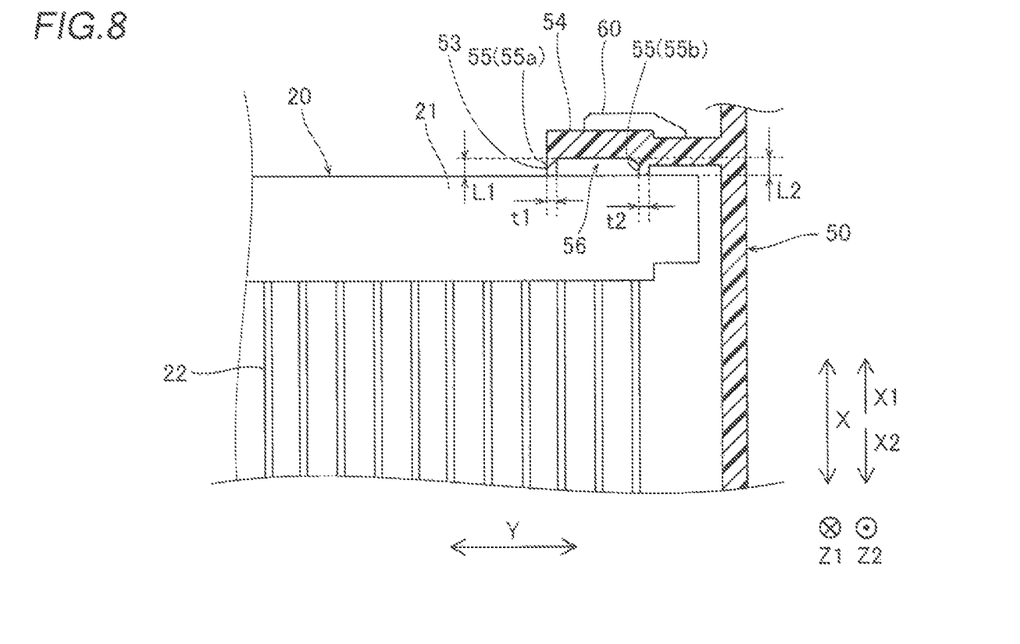
FIG. 8 is a sectional view taken along the line 300-300 in FIG. 6.

According to the present embodiment, as shown in FIG. 8, a flow path 56 through which a fluid (such as water or cooling air) flows is defined by a space surrounded by the first rib 55a and the second rib 55b of the rear housing 50 and the cooler 20. That is, both the first rib 55a and the second rib 55b come into contact with the plate-like portion 21 of the cooler 20. Thus, the first rib 55a, the second rib 55b, and the plate-like portion 21 define the flow path 56 having a substantially rectangular cross-section.

As shown in FIG. 6, holes 57 that serve as fluid inlet and outlets are provided in at least a bottom 551b of the circumferential second rib 55b in a state where an inverter device body 100a is installed (in a state where the inverter device body 100a is installed in the power board 200; see FIGS. 1 and 2). According to the present embodiment, the holes 57 include a hole 57a provided in the bottom 551b of the circumferential second rib 55b and a hole 57b provided in a top 552b of the circumferential second rib 55b in a state where the inverter device body 100a is installed. That is, the circumferential second rib 55b is discontinuously and circumferentially provided on the peripheral edge 54 of the opening 53. In addition, two holes 57a and two holes 57b are provided. The arrangement positions (Y-coordinates) of the holes 57a in a direction Y and the arrangement positions (Y-coordinates) of the holes 57b in the direction Y are substantially the same as each other.

Figure 7:
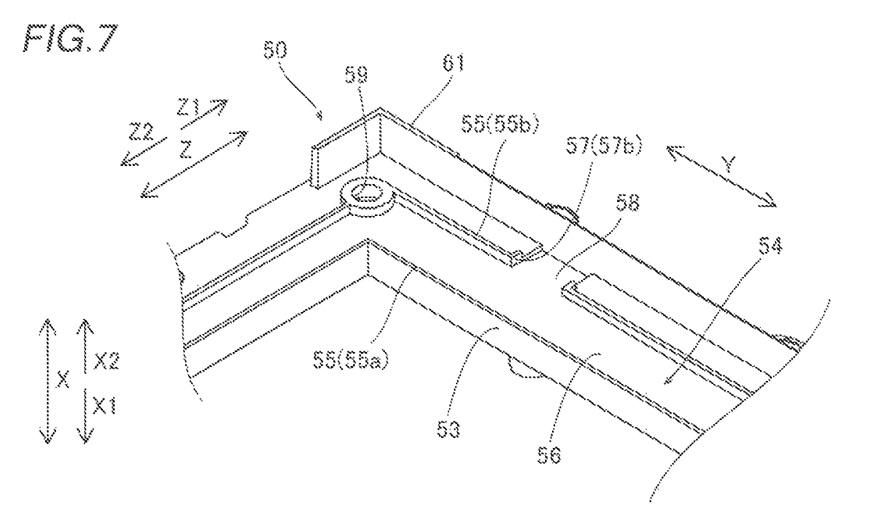
FIG. 7 is a partial enlarged view of FIG. 5.

As shown in FIG. 7, portions of the second rib 55b corresponding to the holes 57b extend toward the Z1 direction side. Similarly, portions of the second rib 55b corresponding to the holes 57a extend toward the Z2 direction side (see FIG. 6). Thus, the fluid that flows into the flow path 56 (that flows out of the flow path 56) is guided by the portions of the holes 57a that extend toward the Z2 direction side and the portions of the holes 57b that extend toward the Z1 direction side.

Grooves 58 extend from the holes 57 toward the Z1 direction side (Z2 direction side) so as to communicate with the flow path 56 surrounded by the first rib 55a and the second rib 55b. These grooves 58 also guide the fluid.

Figure 9:
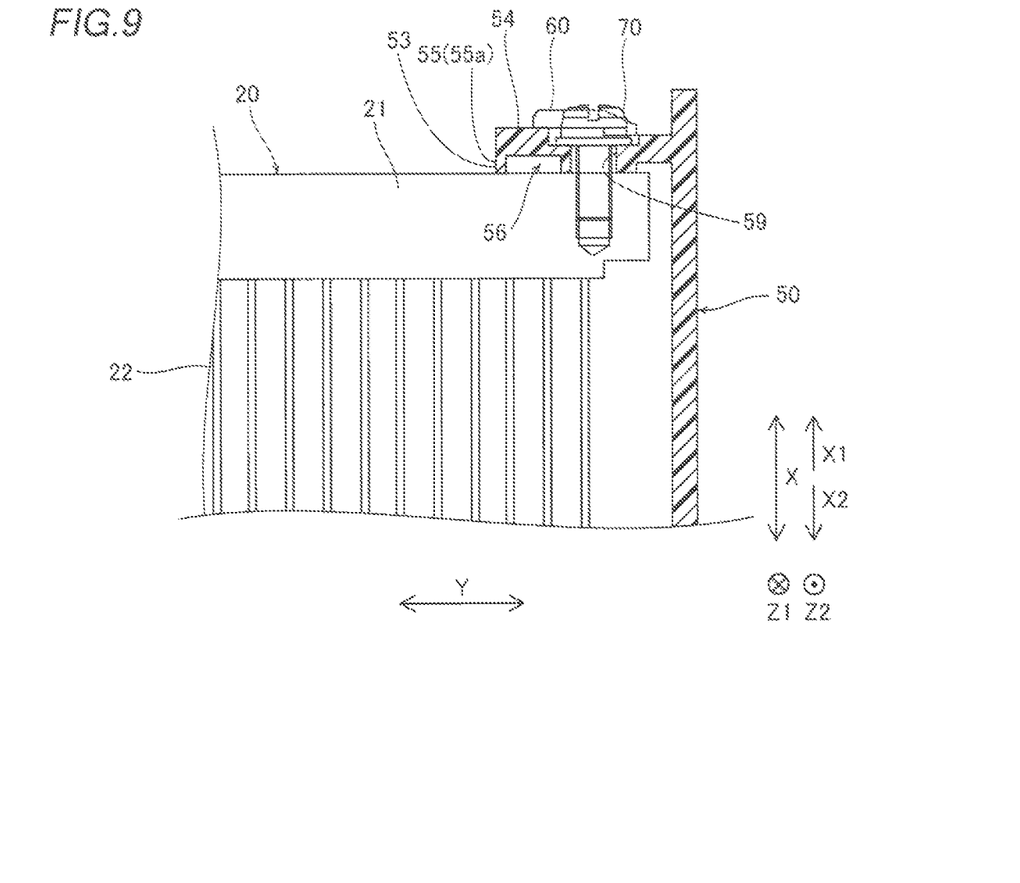
FIG. 9 is a sectional view taken along the line 400-400 in FIG. 6.

According to the present embodiment, as shown in FIG. 9, a screw member 70 that fixes the rear housing 50 to the cooler 20 is provided. The screw member 70 is fastened to the rear housing 50 and the cooler 20 on the outer peripheral side of the first rib 55a such that the first rib 55a and the second rib 55b are pressed against the cooler 20 (see FIG. 8). Specifically, the second rib 55b includes a through-hole 59 through which the screw member 70 passes. A plurality of (eight; see FIG. 6) through-holes 59 are provided. The screw member 70 is fastened (screwed) to the cooler 20 via the through-hole 59 such that the rear housing 50 is fixed to the cooler 20. The screw member 70 is an example of a "fastening member" in the claims.

As shown in FIG. 6, the plurality of through-holes 59 are disposed symmetrically (point-symmetrically) with respect to the center C of the plate-like portion 21 of the cooler 20.

Thus, lifting of the first rib 55*a* and the second rib 55*b* from the plate-like portion 21 caused by the bias (non-uniformity) of the fastening power of the screw member 70 with respect to the rear housing 50 (peripheral edge 54) is significantly reduced or prevented.

Figure 10:
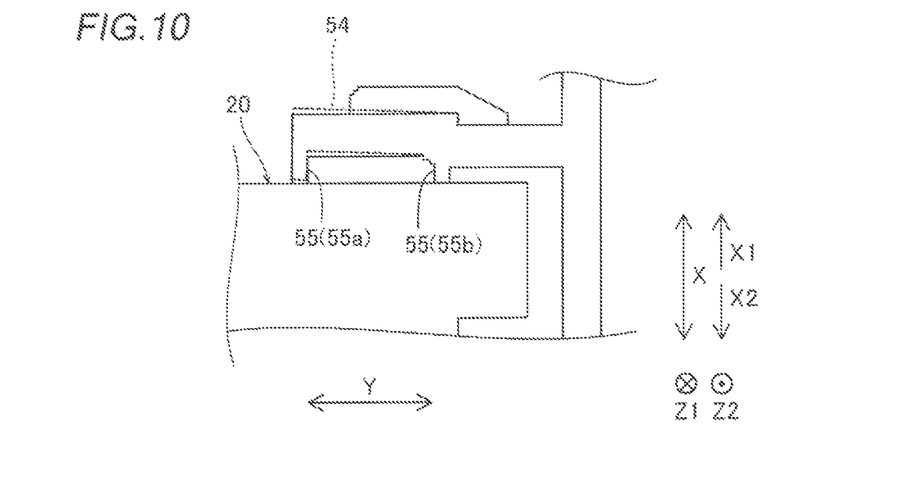
FIG. 10 is a diagram showing a state where the peripheral edge of the rear housing is flexed.

According to the present embodiment, as shown in FIG. 8, the protruding length L1 of the first rib 55*a* toward the cooler 20 is equal to or greater than the protruding length L2 of the second rib 55*b* toward the cooler 20 (according to the present embodiment, L1>L2). As shown in FIG. 10, when the rear housing 50 is fixed to the cooler 20 by the screw member 70 via the through-hole 59 (see FIG. 9), the peripheral edge 54 of the opening 53 may be flexed to be recessed toward the cooler 20 (see the peripheral edge 54 shown by a dotted line). In this case, the first rib 55*a* may be lifted so as to be separate from the cooler 20. Therefore, the protruding length L1 of the first rib 55*a* toward the cooler 20 is set to be greater than the protruding length L2 of the second rib 55*b* toward the cooler 20 such that the first rib 55*a* comes into contact with the cooler 20 even when the peripheral edge 54 is flexed.

As shown in FIG. 8, the thickness t1 of the first rib 55*a* is substantially constant. On the other hand, the thickness t2 of the second rib 55*b* is tapered so as to gradually decrease toward the cooler 20.

According to the present embodiment, as shown in FIG. 6, a reinforcing rib 60 protrudes from the vicinity of the peripheral edge 54 of the opening 53 of the rear housing 50 toward the side opposite to the side on which the cooler 20 is placed. The reinforcing rib 60 reinforces the vicinity of the peripheral edge 54 of the opening 53 on which the rib 55 is provided. Specifically, the reinforcing rib 60 is substantially perpendicular to the second rib 55*b* as viewed in the direction X. In addition, one end of the reinforcing rib 60 overlaps the second rib 55*b* as viewed in the direction X. The reinforcing rib 60 extends from the side on which the second rib 55*b* is placed toward the side on which the first rib 55*a* is placed as viewed in the direction X. The reinforcing rib 60 is substantially plate-like. In addition, a plurality of reinforcing ribs 60 are provided.

Figure 11:
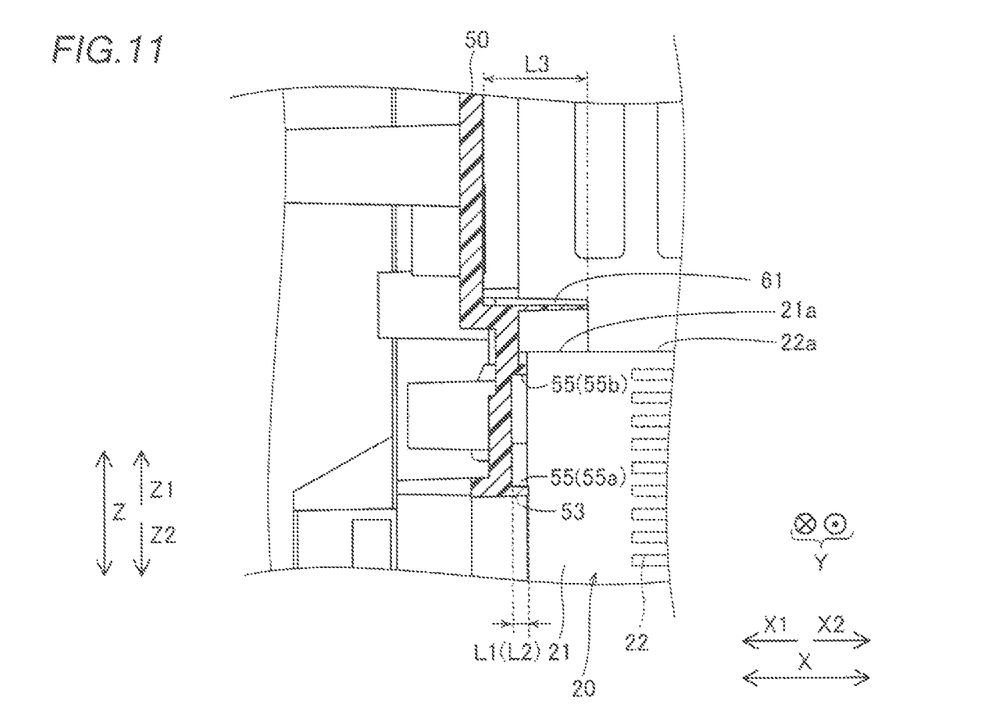
FIG. 11 is a sectional view taken along the line 500-500 in FIG. 6.

According to the present embodiment, as shown in FIG. 6, a wall 61 that protrudes from the vicinity of the peripheral edge 54 of the opening 53 of the rear housing 50 toward the cooler 20 is provided on the outer peripheral side of the rib 55. As shown in FIG. 11, the wall 61 covers the top surface (Z1 direction side) of the cooler 20 in a state where the inverter device body 100*a* is installed (see FIG. 1). Specifically, the wall 61 is disposed on the upper side (Z1 direction side) of the second rib 55*b* in the rear housing 50. As shown in FIG. 6, the wall 61 is substantially U-shaped as viewed from the X2 direction side. Thus, the wall 61 covers the top surface 21*a* of the plate-like portion 21 and the upper end of the side surface 21*b* (see FIG. 4) thereof perpendicular to the top surface 21*a*. As shown in FIG. 7, the wall 61 contacts the grooves 58 in the vicinity of the holes 57*b* of the second rib 55*b* (blocks the grooves 58).

According to the present embodiment, as shown in FIG. 11, the wall 61 does not cover the top surface 22*a* of the fins 22 but covers the top surface 21*a* of the plate-like portion 21. The protruding length L3 of the wall 61 toward the cooler 20 is greater than the protruding length L1 of the first rib 55*a* and the protruding length L2 of the second rib 55*b*.

As shown in FIG. 5, the rear housing 50 includes holes 62 through which the capacitors 13 pass. A plurality of holes 62 are provided so as to correspond to a plurality of capacitors 13. Gaps between the capacitors 13 and the rear housing 50 (holes 62) are sealed with a sealing material (not shown).

Effects of Present Embodiment

According to the present embodiment, the following effects can be obtained.

According to the present embodiment, as hereinabove described, the circumferential rib 55 that comes into contact with the cooler 20 is provided in the vicinity of the peripheral edge 54 of the opening 53 of the rear housing 50. Thus, intrusion of water and dust from the opening 53 of the rear housing 50 into the power conversion circuit 10 (or from the power conversion circuit 10 into the rear housing 50 side) is prevented by the circumferential rib 55 provided on the rear housing 50. Consequently, it is not necessary to provide a component such as a sealing material for constructing the waterproof and dustproof structure separately from the rear housing 50. Thus, it is possible to construct the waterproof and dustproof structure while significantly reducing or preventing an increase in the number of components. Furthermore, the waterproof and dustproof structure is constructed with the rib 55 instead of the surface of the rear housing 50 closer to the cooler 20, and hence the area of a portion of the rib 55 that comes into contact with the cooler 20 is relatively small such that it is possible to significantly reduce or prevent transfer of heat from the cooler 20 to the rear housing 50.

When the number of components (types of components) increases, it is necessary to design the inverter device 100 in consideration of the heat resistance, lifetime, etc. of an increased component as well as the heat resistance and lifetime of the existing components. That is, it is possible to significantly reduce or prevent the design complexity of the inverter device 100 by significantly reducing or preventing an increase in the number of components.

According to the present embodiment, as hereinabove described, the rib 55 includes the first rib 55*a* that protrudes from the vicinity of the peripheral edge 54 of the opening 53 of the rear housing 50 toward the cooler 20 and the second rib 55*b* provided on the outer peripheral side of the first rib 55*a* and that protrudes from the vicinity of the peripheral edge 54 of the opening 53 toward the cooler 20. Thus, the rib 55 includes dual ribs, and hence it is possible to more effectively prevent intrusion of water and dust from the opening 53 of the rear housing 50 into the power conversion circuit 10.

According to the present embodiment, as hereinabove described, the holes 57 that serve as fluid inlet and outlets are provided in at least the bottom 551*b* of the circumferential second rib 55*b* in a state where the inverter device body 100*a* is installed. Thus, the fluid (such as water) that flows through the flow path 56 is discharged out of the flow path 56 from the holes 57 provided in the bottom 551*b*. Thus, it is possible to significantly reduce or prevent accumulation of the fluid (such as water) in the flow path 56.

According to the present embodiment, as hereinabove described, the holes 57 (the holes 57*a* and the holes 57*b*) are provided in the bottom 551*b* and the top 552*b* of the circumferential second rib 55*b* in a state where the inverter device body 100*a* is installed. Thus, the fluid (such as cooling air) that moves from the lower side to the upper side flows in through the holes 57*a* provided in the bottom 551*b*, and flows out from the holes 57*b* provided in the top 552*b* through the flow path 56. That is, the fluid (such as cooling air) that moves from the lower side to the upper side moves without stagnation, and hence it is possible to significantly reduce or prevent a reduction in the cooling efficiency of the cooler 20.

According to the present embodiment, as hereinabove described, the first rib 55a and the second rib 55b are pressed against the cooler 20 by fastening the screw member 70 to the rear housing 50 and the cooler 20 on the outer peripheral side of the first rib 55a. Thus, due to the fastening force of the screw member 70, the first rib 55a and the second rib 55b come into contact with the cooler 20 in a state where the first rib 55a and the second rib 55b are strongly pressed against the cooler 20. Consequently, occurrence of gaps between both the first rib 55a and the second rib 55b and the cooler 20 is significantly reduced or prevented. As a result, it is possible to further significantly reduce or prevent intrusion of water and dust from the opening 53 of the rear housing 50 into the power conversion circuit 10.

According to the present embodiment, as hereinabove described, the protruding length L1 of the first rib 55a toward the cooler 20 is greater than the protruding length L2 of the second rib 55b toward the cooler 20. Thus, even when the first rib 55a is lifted so as to be separate from the cooler 20 due to the fastening force of the screw member 70, it is possible to significantly reduce or prevent separation of the first rib 55a from the cooler 20. Consequently, it is possible to significantly reduce or prevent intrusion of water and dust from the gap between the first rib 55a and the cooler 20.

According to the present embodiment, as hereinabove described, the reinforcing rib 60 protrudes from the vicinity of the peripheral edge 54 of the opening 53 of the rear housing 50 toward the side opposite to the side on which the cooler 20 is placed. Thus, the strength of a portion of the rear housing 50 in the vicinity of the rib 55 is increased by the reinforcing rib 60, and hence deformation of the portion of the rear housing 50 in the vicinity of the rib 55 is significantly reduced or prevented. Consequently, occurrence of the gap between the rib 55 and the cooler 20 due to the deformation of the portion of the rear housing 50 in the vicinity of the rib 55 is significantly reduced or prevented. Consequently, it is possible to further significantly reduce or prevent intrusion of water and dust into the power conversion circuit 10 from the opening 53 of the rear housing 50.

According to the present embodiment, as hereinabove described, the wall 61 that protrudes from the vicinity of the peripheral edge 54 of the opening 53 of the rear housing 50 toward the cooler 20 is provided on the outer peripheral side of the rib 55 so as to cover the top surface of the cooler 20 in a state where the inverter device body 100a is installed. Thus, the wall 61 can significantly reduce or prevent direct dropping of water, which drops from the top surface side, onto the cooler 20.

According to the present embodiment, as hereinabove described, the wall 61 does not cover the top surface 22a of the fins 22 but covers the top surface 21a of the plate-like portion 21. Thus, the fins 22 are not covered by the wall 61, and hence it is possible to prevent the wall 61 from blocking flow of cooling air that hits the fins 22 (that passes between the fins 22).

[Modification]

The embodiment disclosed this time must be considered as illustrative in all points and not restrictive. The range of the present invention is shown not by the above description of the embodiment but by the scope of claims for patent, and all modifications within the meaning and range equivalent to the scope of claims for patent are further included.

For example, while the rib 55 includes two ribs (the first rib 55a and the second rib 55b) in the aforementioned embodiment, the present invention is not restricted to this. For example, the rib 55 may alternatively include one rib, or three or more ribs.

While both of the top 552b and the bottom 551b of the second rib 55b include the holes 57 in the aforementioned embodiment, the present invention is not restricted to this. For example, only the bottom 551b of the second rib 55b may alternatively include the holes 57 (holes 57a).

While the rear housing 50 is fixed to the cooler 20 by the screw member 70 in the aforementioned embodiment, the present invention is not restricted to this. For example, the rear housing 50 may alternatively be fixed to the cooler 20 by a fastening member other than the screw member 70.

While the reinforcing rib 60 overlaps only the second rib 55b in the planar view in the aforementioned embodiment, the present invention is not restricted to this. For example, the reinforcing rib 60 may alternatively overlap both of the first rib 55a and the second rib 55b.

While the wall 61 is substantially U-shaped as viewed from the X2 direction side in the aforementioned embodiment, the present invention is not restricted to this. For example, the wall 61 may alternatively be substantially linear as viewed from the X2 direction side.

While the protruding length L1 of the first rib 55a toward the cooler 20 is greater than the protruding length L2 of the second rib 55b toward the cooler 20 in the aforementioned embodiment, the present invention is not restricted to this. For example, when the first rib 55a is not separate (not lifted) from the cooler 20 even due to the fastening force of the screw member 70, the protruding length L1 of the first rib 55a toward the cooler 20 and the protruding length L2 of the second rib 55b toward the cooler 20 may alternatively be equal to each other. Even in this case, it is possible to significantly reduce or prevent intrusion of water and dust from the gap between the first rib 55a and the cooler 20.

What is claimed is:

1. An inverter device comprising:
a heat generator including a power conversion element;
a cooler that cools the heat generator; and
a cooler-side housing that covers the cooler and includes
an opening that exposes a side of the cooler closer to the heat generator, and
a circumferential rib that is provided in a vicinity of a peripheral edge of the opening of the cooler-side housing, and protrudes from a cooler-side surface of the cooler-side housing facing the cooler and toward the cooler to contact the cooler,
wherein the circumferential rib includes a first rib that protrudes from the vicinity of the peripheral edge of the opening of the cooler-side housing toward the cooler and comes into contact with the cooler, and a second rib that is provided on an outer peripheral side of the first rib and that protrudes from the vicinity of the peripheral edge of the opening toward the cooler and comes into contact with the cooler.

2. The inverter device according to claim 1, wherein
a flow path through which a fluid flows is defined by a space surrounded by the first rib and the second rib of the cooler-side housing and the cooler, and
a hole that serves as an inlet and outlet of the fluid is provided in at least a bottom of the second rib in a state where an inverter device body is installed.

3. The inverter device according to claim 2, wherein the hole is provided in the bottom of the second rib and another hole is provided in a top of the second rib in the state where the inverter device body is installed.

4. The inverter device according to claim 1, further comprising a fastening member that fixes the cooler-side housing to the cooler, wherein the first rib and the second rib are pressed against the cooler by fastening the fastening member to the cooler-side housing and the cooler on the outer peripheral side of the first rib.

5. The inverter device according to claim 4, wherein a protruding length of the first rib toward the cooler is equal to or greater than a protruding length of the second rib toward the cooler.

6. The inverter device according to claim 1, further comprising a reinforcing rib that protrudes from the vicinity of the peripheral edge of the opening of the cooler-side housing toward a side opposite to a side on which the cooler is placed.

7. The inverter device according to claim 1, further comprising a wall that protrudes from the vicinity of the peripheral edge of the opening of the cooler-side housing toward the cooler on an outer peripheral side of the circumferential rib so as to cover a top surface of the cooler in a state where an inverter device body is installed.

8. The inverter device according to claim 7, wherein the cooler includes
    a plate-shaped portion on which the heat generator is placed and
    a fin that extends from the plate-shaped portion, and
the wall does not cover a top surface of the fin and covers a top surface of the plate-shaped portion.

9. An inverter device comprising:
a heat generator including a power conversion element;
a cooler that cools the heat generator; and
a cooler-side housing that covers the cooler and includes
    an opening that exposes a side of the cooler closer to the heat generator, and
    a circumferential rib that is provided in a vicinity of a peripheral edge of the opening of the cooler-side housing, and protrudes from a cooler-side surface of the cooler-side housing facing the cooler and toward the cooler to contact the cooler,
wherein the circumferential rib includes
a first rib surrounding an entirety of the peripheral edge of the opening of the cooler-side housing and protruding from the cooler-side surface of the cooler-side housing toward the cooler to contact the side of the cooler, and
a second rib protruding from the cooler-side surface of the cooler-side housing toward the cooler to contact the side of the cooler, the second rib surrounding and spaced apart from a periphery of the first rib to form a flow path for guiding a fluid, and including a plurality of holes adapted to guide the fluid into and out of the flow path.

10. The inverter device according to claim 9, wherein the cooler-side housing further includes a wall arranged on an outer peripheral side of the second rib and extending from the cooler-side surface of the cooler-side housing toward the cooler beyond the second rib so that the wall contacts another side of the cooler perpendicular to the side of the cooler to cover the another side.

* * * * *